United States Patent
Kirisawa

(10) Patent No.: US 7,519,133 B2
(45) Date of Patent: Apr. 14, 2009

(54) TRANSMISSION OUTPUT CONTROL APPARATUS AND ITS METHOD, TRANSMITTER USING THE SAME, AND RECORDING MEDIUM RECORDING TRANSMISSION OUTPUT CONTROL PROGRAM

(75) Inventor: Akihiro Kirisawa, Tokyo (JP)

(73) Assignee: NEC Corporation, Tokyo (JP)

( * ) Notice: Subject to any disclaimer, the term of this patent is extended or adjusted under 35 U.S.C. 154(b) by 594 days.

(21) Appl. No.: 11/361,892

(22) Filed: Feb. 24, 2006

(65) Prior Publication Data

US 2006/0193397 A1   Aug. 31, 2006

(30) Foreign Application Priority Data

Feb. 25, 2005   (JP)   ............................. 2005-049909

(51) Int. Cl.
*H04L 25/03*   (2006.01)
(52) U.S. Cl. ...................................... 375/296
(58) Field of Classification Search ................ 375/296, 375/297; 455/13.1, 114.2, 114.3
See application file for complete search history.

(56) References Cited

U.S. PATENT DOCUMENTS

| 6,181,188 B1 * | 1/2001 | Shibata | 327/331 |
| 7,103,029 B1 * | 9/2006 | Minowa | 370/342 |

FOREIGN PATENT DOCUMENTS

| JP | 8-97734 | 4/1996 |
| JP | 8-102767 | 4/1996 |

* cited by examiner

*Primary Examiner*—Don N Vo
(74) *Attorney, Agent, or Firm*—Scully, Scott, Murphy & Presser, P.C.

(57) ABSTRACT

Disclosed is a transmission output control apparatus for controlling transmitter output power to coincide with a first reference value. The apparatus includes an averaging circuit and a control section. The averaging circuit calculates an average value of said detection value of the output power. The control section outputs a differential signal between the average value and the first reference value as a transmitter output level control signal when the difference between said average value and said first reference value is less than a second reference value. The control section outputs a differential signal between said detection value and the first reference value as a transmitter output level control signal when the difference is equal to or greater than the second reference value.

12 Claims, 7 Drawing Sheets

TRANSMISSION OUTPUT CONTROL APPARATUS AND ITS METHOD, TRANSMITTER USING THE SAME, AND RECORDING MEDIUM RECORDING TRANSMISSION OUTPUT CONTROL PROGRAM

BACKGROUND OF THE INVENTION

1. Field of the Invention

The present invention relates to a transmission output control apparatus and its method and a transmitter using the same and, more particularly, to a transmission output control technique for controlling transmission power in a transmitter.

2. Description of the Related Art

FIG. 1 shows an example of a conventional transmission output control apparatus. In FIG. 1, a mixer 2 and a synthesizer 5 transform the output of a modulator 1 into an RF signal and supply it to an amplifier 4 via a variable attenuator 3. The variable attenuator and the amplifier 4 amplify the RF signal to a predetermined transmission output and output it. A directional coupler 8 extracts part of the output of the amplifier 4 and supplies it to a detector 8. The detector 8 detects the extracted signal. A comparator 9 derives a differential signal between a detection voltage and a first reference voltage 12. Then, a low-pass filter (LPF) 20 and an error amplifier 6 suppress the variation in the differential signal as well as amplifying it. The error amplifier 6 supplies the output to the variable attenuator 3 as an attenuation amount control voltage. The variable attenuator 3 changes its gain based on the attenuation amount control voltage from the error amplifier 6. In this manner, the transmission output control apparatus in FIG. 1 controls such that the transmitter output keeps a fixed level at all times.

FIG. 2A shows the output voltage of the modulator in FIG. 1. The instantaneous level variation in the output voltage is large. Therefore, even if the LPF 20 performs smoothing of the output of the comparator 9, it is difficult to sufficiently suppress the variation. Because of this, as shown in FIG. 2B, the transmitter output level follows the envelope of the modulator output to a certain extent.

To prevent this, it is conceivable to increase the time constant of the LPF 20. However, if the time constant of the LPF 20 increases, troubles will occur when it is necessary to change the transmitter output level. In other words, if changing the transmitter output level by changing the first reference voltage, the LPF 20 suppresses the change in output of the comparator 9 accompanying the change in the first reference voltage. Because of this, it takes time for the transmitter output level to reach a predetermined transmission output level after the change. Cases where it is necessary to change the transmitter output level include a case of starting the apparatus and a case of changing the frequency. Further, also when another apparatus is performing an Automatic Transmit Power Control (ATPC), the transmitter changes the output level.

Japanese Patent Application Laid-Open No. HEI 8-97734 (1996) (document 1) disclose examples of techniques relating to such a transmission power control circuit. The document 1 discloses a transmission power control circuit of a transmitter using both the AM modulation wave and the FM modulation wave. The transmission power control circuit changes the time constant of an LPF according to the type of modulation wave. However, this technique does not sufficiently solve the problem caused by an instantaneous level fluctuation in the transmission signal.

Japanese Patent Application Laid-Open No. HEI 8-102767 (1996) (document 2) discloses a transmission power control circuit in which the envelope feedback loop in the transmitter controls a transmitter output level such that the baseband modulation signal becomes the same as the envelope of the modulated signal when gain fluctuation of a high frequency power amplifier etc. occurs. This transmission power control circuit outputs modulated waves at a fixed power regardless of the gain fluctuation of the power amplifier. However, it does not sufficiently solve the problem about the instantaneous level change in the transmission signal.

SUMMARY OF THE INVENTION

A first exemplary feature of the invention provides a transmission output control apparatus which suppresses the fluctuation in the transmitter output level against the instantaneous level fluctuation in the transmission signal and, the transmission output level of which quickly converges at the changed transmission output level when changing the transmitter output level.

According to a first exemplary aspect of the invention, there is provided a transmission output control apparatus for controlling transmitter output power to coincides with a first reference value. The apparatus includes an averaging circuit a control section. The averaging circuit calculates an average value of said detection value of the output power. The control section outputs a differential signal between the average value and the first reference value as a transmitter output level control signal when the difference between said average value and said first reference value is less than a second reference value. The control section outputs a differential signal between said detection value and the first reference value as a transmitter output level control signal when the difference between said average value and said first reference value is equal to or greater than the second reference value.

The first exemplary aspect of the invention controls, when the difference between the average value of transmitter output and a first reference value is greater than or equal to a second reference value, the transmitter output depending on the difference between a detection level and the first reference value. Further, the first exemplary aspect of the invention controls, when the difference between the average value of the transmitter output and the first reference value is less than the second reference value, the transmitter output depending on the difference between the average value and the first reference value. As a result, the first exemplary aspect of the invention suppresses, the fluctuation in the output level against the instantaneous level fluctuation in the transmission signal on one hand, and reduces the time for the transmitter output level to reach the changed transmission output level, when changing the transmitter output level, on the other.

DETAILED DESCRIPTION OF THE PREFERRED EMBODIMENTS

Figure 3:
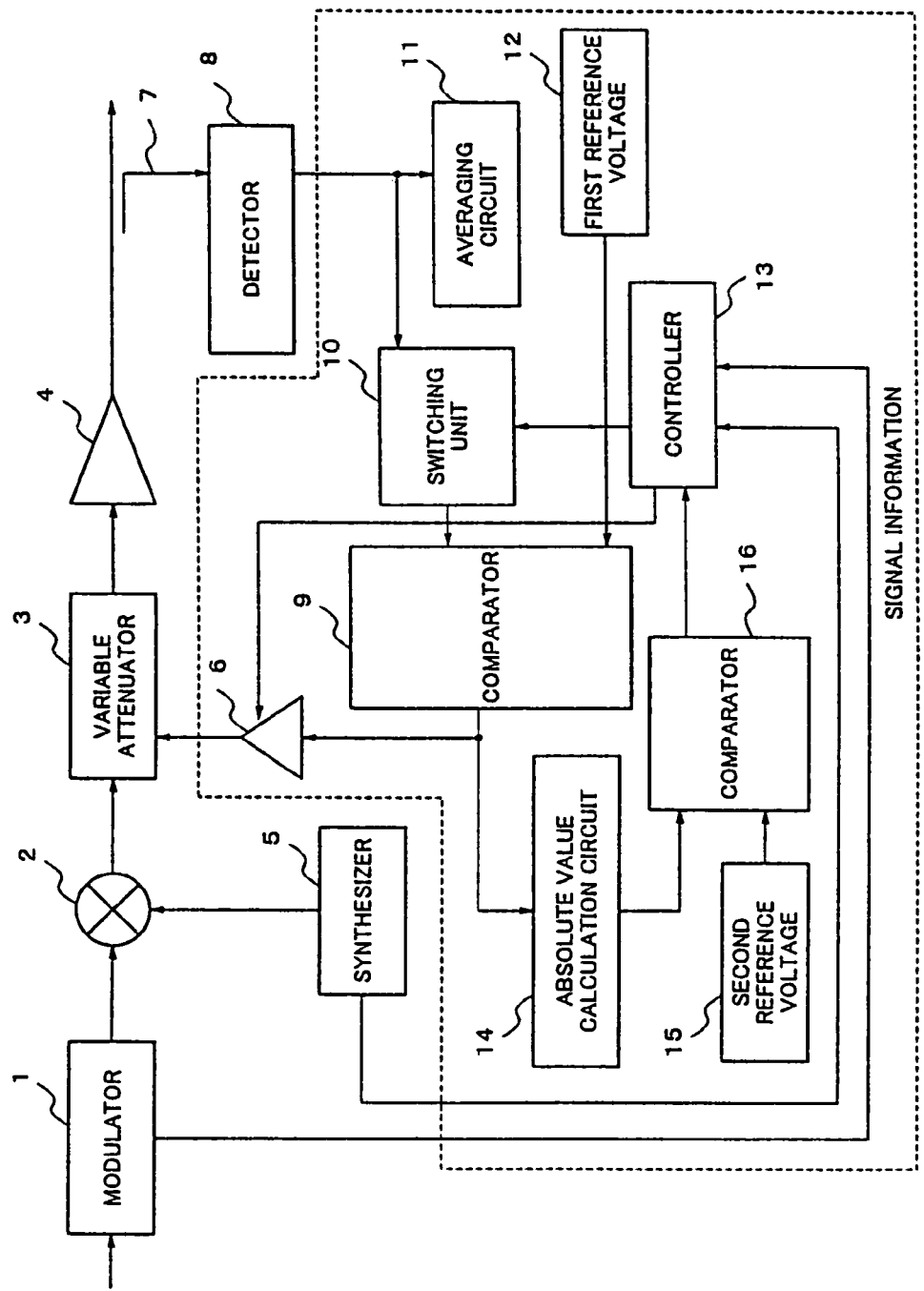
FIG. 3 is a block diagram showing an embodiment of the present invention.

The following is described with reference to drawings. FIG. 3 is a block diagram showing an embodiment of the present invention. In FIG. 3, the same components as those in FIG. 1 have the same reference numbers.

In FIG. 3, a mixer 2 and a synthesizer 5 transform the output of a modulator 1 into an RF signal. A variable attenuator 3 and an amplifier 4 amplify the RF signal to a predetermined transmission output level determined by the output of an error amplifier 6 and output it. A directional coupler 7 supplies part of the output of the amplifier 4 to a detector 8. This embodiment keeps the transmission output level constant by appropriately varying the attenuation value of the variable attenuator 3.

The detector 8 supplies a detection voltage to a first input terminal of a switching unit 10 and an averaging circuit 11. The averaging circuit averages the detection voltage. Further, it is possible to set the time constant of the averaging circuit to a value longer than that of an LPF 7 in FIG. 1. The output of the averaging circuit 11 is supplied to a second input terminal of the switching unit 10.

A comparator 9 compares the output of the switching unit 10 and a first reference voltage 12, and supplies a differential signal to the error amplifier 6 and an absolute value calculation circuit 14. The absolute value calculation circuit 14 calculates the absolute value of the differential signal.

A comparator 16 compares the output of the absolute value calculation circuit 14 and a second reference voltage 15, and supplies the comparison result to a controller 13. The output of the controller 13 is connected to the switching unit 10.

Figure 1:
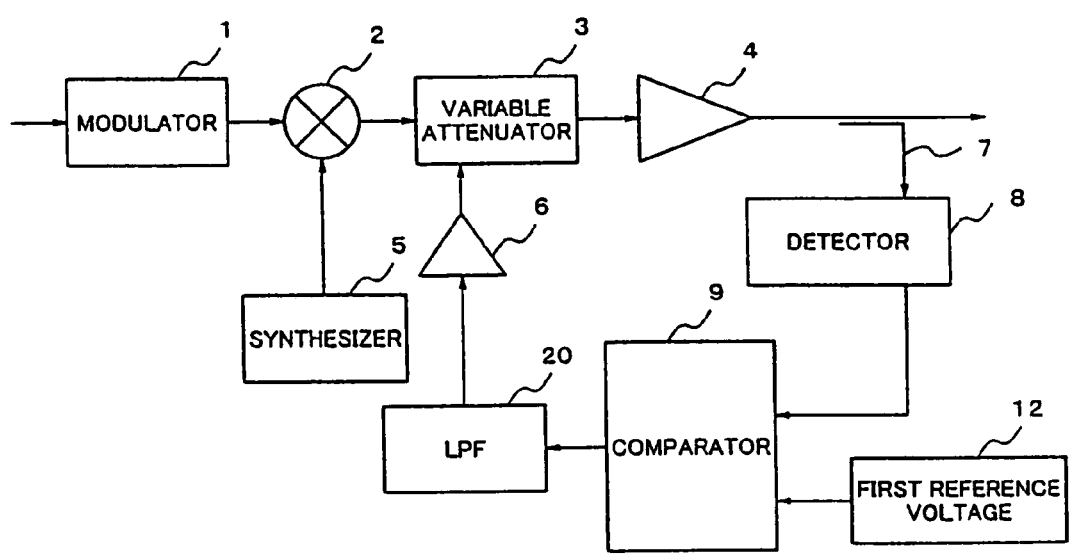
FIG. 1 is a block diagram showing the related art.

The output of the controller may be supplied to the error amplifier 6 in another exemplary embodiment. Moreover, the controller 13 may receive signal information from the modulator 1. In FIG. 1, the part enclosed by a broken line 19 constitutes a control unit.

Next, there will be described the operation of a transmission output control circuit in this exemplary embodiment of the present invention.

Figure 2A:
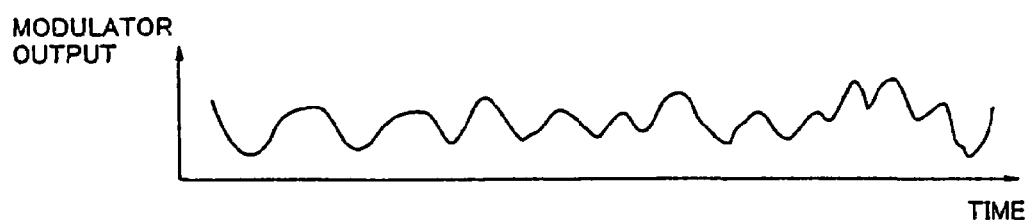
FIG. 2A is a waveform diagram showing an output of a modulator in FIG. 1.

The directional coupler 7 supplies part of the power of a transmission signal output from the amplifier 4 to the detector 8. The detector 8 outputs a detection voltage depending on the supplied transmission signal. As shown in FIG. 2A, the modulator output is a signal having the envelope and ripple components of the modulation wave.

Figure 4A:
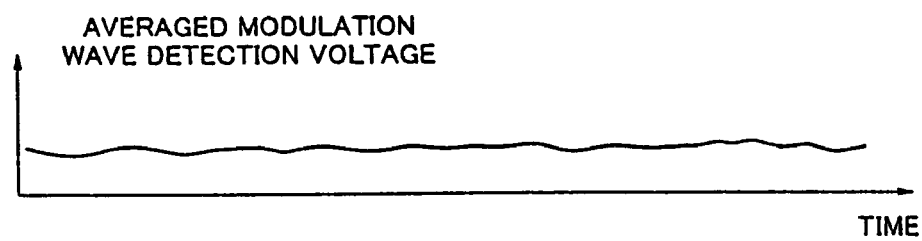
FIG. 4A is a diagram showing an output of an averaging circuit 11 when not changing the transmitter output level.

The averaging circuit 11 performs smoothing of the detection voltage and forms it into a signal with a small amount of fluctuation (refer to FIG. 4A). In the normal state, the switching unit 10 selects the averaging circuit 11 by a direction from the control circuit. At this time, the comparator 9 receives the averaged detection voltage. Additionally, as the averaging circuit, it is possible to use a low-pass filter with a narrow pass band.

Figure 2B:
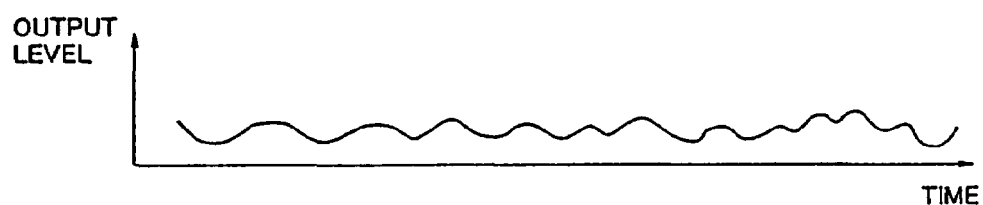
FIG. 2B is a waveform diagram showing an output level of a transmitter in FIG. 1.

The comparator 9 outputs a differential signal between the averaged detection voltage and the first reference voltage 12. The error amplifier 6 amplifies the differential signal and controls the gain of the variable attenuator 3. A loop composed of from the variable attenuator 3 to the error amplifier 6 keeps the transmitter output level constant (refer to FIG. 4B). The averaging circuit 11 stabilizes the transmitter output even if the transmission signal is the modulation wave. Without the averaging circuit 11, the detection voltage is fed back to the variable attenuator as it is, therefore, the transmission output varies depending on the envelope of the modulation wave (refer to FIG. 2B).

Next, there will be described the operation of each part when the transmitter changes its output level.

The transmitter changes its output level by changing the first reference voltage 12. As a case where the transmitter changes its output level, there is a case of outputting a specified level intentionally (manually). Further, a transmitter employing the ATPC (Automatic Transmit Power Control) technique as the measures against fading frequently changes its transmission power. Furthermore, also when starting the apparatus (turning the power on) etc., the transmitter changes its transmission power from zero to a predetermined value.

The absolute value calculation circuit 14 calculates the absolute value of the output of the comparator 9 and supplies it to the comparator 16. The comparator 16 compares the output of the absolute value calculation circuit and the second reference voltage 15.

When the first reference voltage 12 is changed, the output of the absolute value calculation circuit 14 becomes greater because the output of the comparator 9 is the differential signal between the detection signal and the first reference voltage. When the absolute value of the output of the comparator 9 becomes equal to or greater than the second reference voltage 15, the comparator 16 supplies a high-level signal to the controller 13.

In other words, the comparator 16 judges whether or not the error (the output of the comparator 9) between the transmitter output level and the first reference voltage is greater than a fixed level (the second reference voltage). When the comparator 16 judges that the error is greater than the fixed level, the controller 13 causes the switching unit 10 to output the output of the detector 8. As a result, the transmitter output level quickly follows the change in the first reference voltage.

At this time, it is also possible for the controller 13 to increase the gain of the error amplifier 6. Due to this, it is possible for the transmitter to more quickly change its output level.

Figure 4B:
FIG. 4B is a waveform diagram showing the transmission output level in a first embodiment of the present invention when not changing the transmitter output level.
Figure 5A:
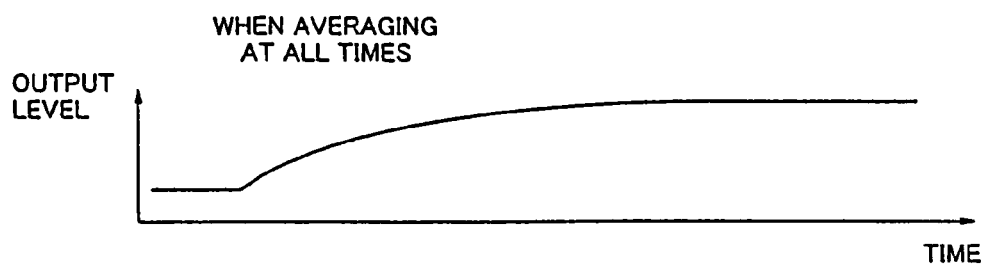
FIG. 5A is a diagram showing a temporal change in the transmission output level in the related art when changing the transmitter output.
Figure 5B:
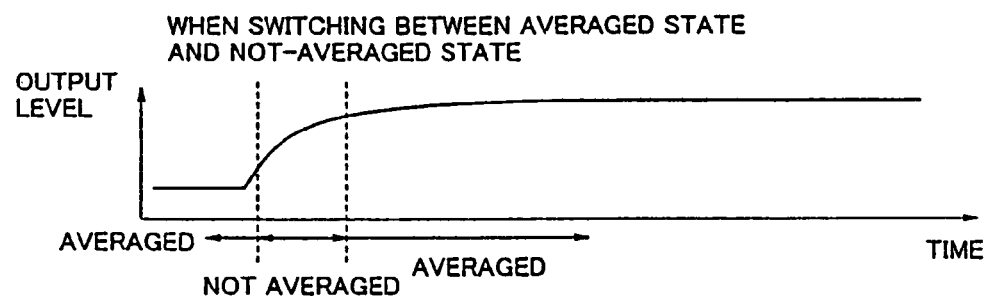
FIG. 5B is a diagram showing a temporal change in the transmitter output level in the exemplary embodiment of the present invention when changing the transmitter output.

As shown in FIG. 4A and FIG. 4B, by averaging the detection voltage, it is possible for the transmitter to stabilize its output power. If there is no the averaging circuit, it is not possible for the transmitter to sufficiently suppress the fluctuation in the transmission output. Further, if performing the control of the transmission power by using only the averaged detection voltage, it is not possible for the transmitter to quickly change the output power when changing the transmission power. The present embodiment bypasses the averaging circuit 11 when the absolute value of the output of the comparator 9 becomes equal to or greater than the fixed level (the second reference value). After this, when the absolute value of the output of the comparator 16 becomes less than the fixed level, the controller 13 causes the switching unit to select the output of the averaging circuit 11. As a result, the control of the transmission power in the present embodiment increases in speed, as shown in FIG. 5B.

Figure 6:
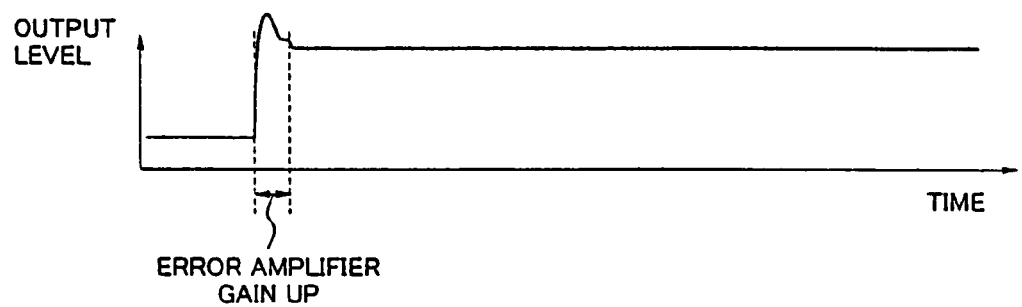
FIG. 6 is a waveform diagram for explaining effects in another embodiment of the present invention when changing the transmission level.

Further, in another exemplary embodiment, by increasing the gain of the error amplifier 6 also, it is possible to perform control at a higher speed as shown in FIG. 6.

The controller 13 may be supplied with information also from the modulator 1 and the synthesizer 13. When the signal information from the modulator indicates that the modulation wave is CW (no modulation), the controller 13 may also bypass the averaging circuit 11. Further, when the information from the synthesizer 5 indicates the change in the transmission frequency, it is made possible for the controller 13 to quickly stabilize the transmission output by setting a bypass for the averaging circuit 11 or an increase in gain of the error amplifier 6.

As described above, there is no averaging circuit 11, the transmission output varies as shown in FIG. 2A. As shown in FIG. 4B, averaging of the detection voltage stabilizes the transmission output. However, if the signal is averaged at all times, the change in the transmission output becomes slow in speed as shown in FIG. 5A. In the present embodiment, when the absolute value of the error voltage, which is the output of the comparator 9, exceeds the second reference voltage, the change in the transmission power is increased in speed by bypassing the averaging circuit 11 as shown in FIG. 5B. Therefore, in the present embodiment, stabilization of the transmission output level at the time of input of the modulation wave and the speedy control at the time of the change in the transmission level can coexist.

Figure 7:
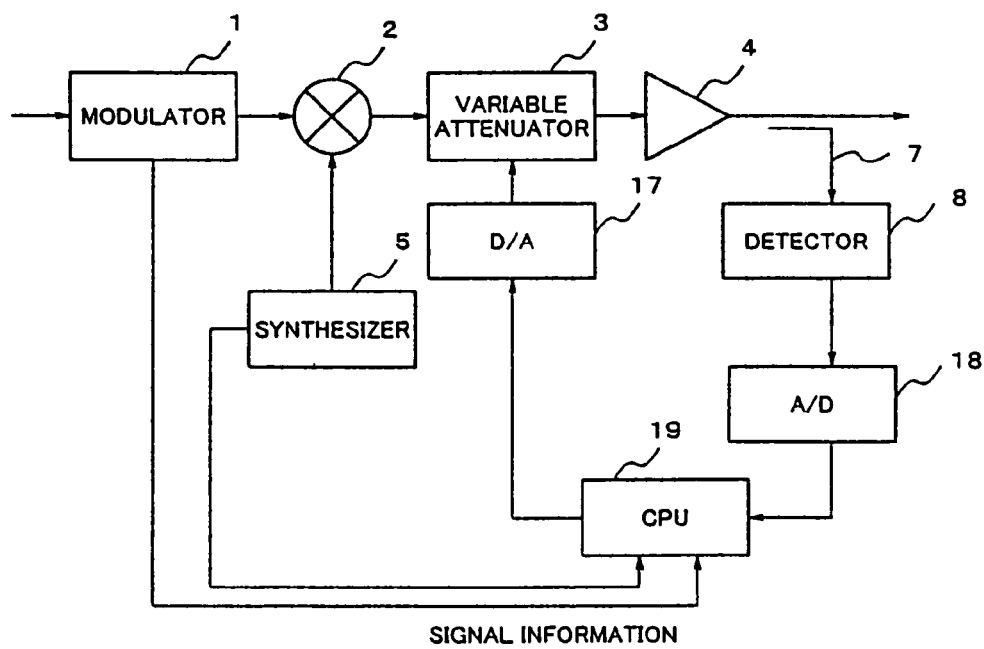
FIG. 7 is a block diagrams showing still another embodiment of the present invention.

FIG. 7 is a block diagram showing a still another exemplary embodiment of the present invention and the same portions as those in FIG. 3 have the same reference numbers. The present embodiment realizes the function equivalent to that of the transmitter in FIG. 3 with firmware according to a CPU 19'.

In the present embodiment, an A/D converter 18 transforms the output of the detector 8 into a digital signal and supplies it to the CPU 19'. Then a D/A converter 17 transforms the output of the CPU 19' into an analog signal. The output of the D/A converter 17 controls the gain of the attenuator 3. The CPU 19' realizes the function of a control unit 19 in FIG. 3. In the present embodiment, a recording medium (not shown) such as ROM stores the operation already explained with reference to FIG. 3 as a program beforehand. Then, the CPU 19 reads this program and operates similarly as in the embodiment in FIG. 3.

Figure 8:
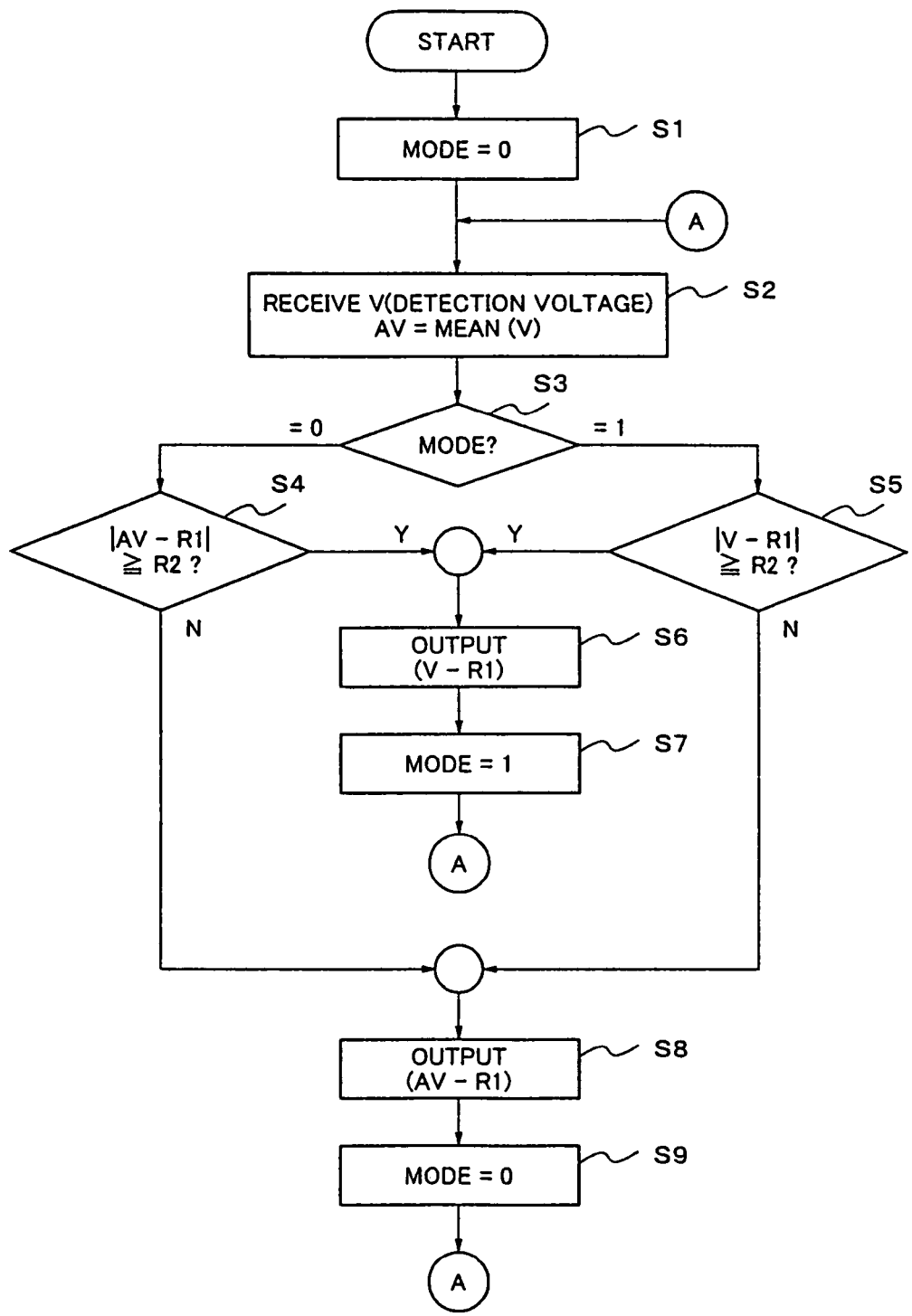
FIG. 8 is a flow chart for explaining a program for causing a computer to operate as a control unit of a transmission power control apparatus.

FIG. 8 shows a flow chart of this program.

In FIG. 8, in step S1, the CPU 19' initially sets a parameter (MODE) to "0". The parameter corresponds to an output signal of the controller 13 in FIG. 3.

In step S2, the CPU 19' receives the detection voltage (V) from the A/D converter 8 and calculates the average of the detection voltage (AV) in terms of time.

Next, the CPU checks the parameter Mode. If mode=1, the process of the CPU proceeds to step S4. Otherwise, the processing of the CPU proceeds to step S5.

In step S4, the CPU obtains the absolute value of the differential signal between the average value (AV) and the first reference value (R1). Then, judgment is made whether or not the absolute value is equal to or more than the second reference voltage (R2). When the judgment result in step S4 is "YES", the process of the CPU 19' proceeds to step S6 and when not, the process of the CPU 19' proceeds to step S8.

In step S5, the CPU obtains the absolute value of the differential signal between the detection level (V) and the first reference value (R1). Then, judgment is made whether or not the absolute value is equal to or more than the second reference voltage (R2). When the judgment result in step S5 is "YES", the process of the CPU 19' proceeds to step S6 and when not, the process of the CPU 19' proceeds to step S8.

In step S6, the CPU 19' outputs the differential signal (the detection level—the first reference value) to the D/A converter 17. In step S7, the MODE is set to "1". When this process ends, the process of the CPU 19' returns to step S2. Incidentally, in step S7, the CPU 19' may multiply the differential signal by a fixed factor (greater than one).

In step S8, the CPU 19' outputs the differential signal (the average value—the first reference value) to the D/A converter 17. In step S9, the MODE is set to "0". When this process ends, the process of the CPU 19' returns to step S2.

While this invention has been described in connection with certain exemplary embodiments, it is to be understood that the subject matter encompassed by way of this invention is not be limited to those specific embodiments. On the contrary, it is intended for the subject matter of the invention to include all alternatives, modifications and equivalents as can be included with the sprit and scope of the following claims. Further, the inventor's intent is to retain all equivalents even if the claims are amended during prosecution.

What is claimed is:

1. A transmission output control apparatus for controlling transmitter output power such that a detection value of a transmitter output coincides with a first reference value, comprising:
   an averaging circuit which calculates an average value of said detection value; and
   a control section, which outputs a differential signal between said average value and said first reference value as a transmitter output level control signal when the difference between said average value and said first reference value is less than a second reference value, and which outputs a differential signal between said detection value and said first reference value as a transmitter output level control signal when the difference between said average value and said first reference value is equal to or greater than the second reference value.

2. The transmission output control apparatus according to claim 1, wherein:
   said control section further includes an error amplifier;
   the error amplifier amplifies the differential signal between said detection value and said first reference value with a first gain employed when the difference between said average value and said first reference value is greater than said second reference value, and said control unit outputs the amplified differential signal as said transmitter output level control signal; and
   otherwise, the error amplifier amplifies the differential signal between said average value and said first reference value with a second gain, and said control unit outputs the amplified differential signal as said transmitter output level control signal.

3. The transmission output control apparatus according to claim 2, wherein said first gain is greater than said second gain.

4. A transmitter including the transmission output control apparatus according to claim 1.

5. A transmitter including the transmission output control apparatus according to claim 2.

6. A transmitter including the transmission output control apparatus according to claim 3.

7. A transmission output control method for controlling a transmitter such that a transmitter output becomes a first reference value, comprising the steps of:
   (a) obtaining a detection level of said transmitter output;

(b) deriving an average value of said detection level;

(c) outputting the differential signal between said average value and said first reference value as a transmitter output level control signal when the difference between said average value and said first reference value is equal to or less than a second reference value; and (d) outputting the differential signal between said detection level and said first reference value as a transmitter output level control signal when the difference between said average value and said first reference value is greater than said second reference value.

8. The transmission output control method according to claim 7, wherein:

said step (c) further includes amplifying the differential signal between said average value and said first reference value with a second gain; and said step (d) includes amplifying the differential signal between said detection level and said first reference value with a first gain.

9. The transmission output control method according to claim 8, wherein said first gain is greater than said second gain.

10. A recording medium recording a program for causing a computer to perform a transmission output control method for controlling a transmitter output so as to become a first reference value, wherein said program comprising the steps of:

(a) obtaining a detection level by detecting said transmitter output;

(b) deriving an average value of said detection level;

(c) outputting the differential signal between said average value and said first reference value as a transmitter output level control signal when the difference between said average value and said first reference value is less than a second reference value; and (d) outputting the differential signal between said detection level and said first reference value as said transmitter output level control signal when the difference between said average value and said first reference value is equal to or more than said second reference value.

11. The recording medium according to claim 10, wherein:

said step (c) further includes amplifying the differential signal between said average value and said first reference value with a second gain; and said step (d) includes amplifying the differential signal between said detection level and said first reference value with a first gain.

12. The recording medium according to claim 11, wherein said first gain is greater than said second gain.

* * * * *